United States Patent [19]

Ekstrom

[11] 4,303,861

[45] Dec. 1, 1981

[54] PHOTON DETECTOR SYSTEM

[75] Inventor: Philip A. Ekstrom, Lexington, Ky.

[73] Assignee: Battelle Development Corporation, Columbus, Ohio

[21] Appl. No.: 134,846

[22] Filed: Mar. 28, 1980

[51] Int. Cl.³ .............................................. G01T 1/22
[52] U.S. Cl. .................................................... 250/370
[58] Field of Search ...................... 250/338, 370, 371; 357/30

[56] References Cited

U.S. PATENT DOCUMENTS

| | | | |
|---|---|---|---|
| 3,757,123 | 9/1973 | Archer et al. | 250/370 |
| 3,864,722 | 2/1975 | Carnes | 250/370 |
| 4,258,375 | 3/1981 | Hsieh et al. | 357/30 |

*Primary Examiner*—Alfred F. Smith
*Assistant Examiner*—Janice A. Howell
*Attorney, Agent, or Firm*—Biebel, French & Nauman

[57] ABSTRACT

A photon detector includes a semiconductor device, such as a Schottky barrier diode, which has an avalanche breakdown characteristic. The diode is cooled to cryogenic temperatures to eliminate thermally generated charge carriers from the device. The diode is then biased to a voltage level exceeding the avalanche breakdown threshold level such that, upon receipt of a photon, avalanche breakdown occurs. This breakdown is detected by appropriate circuitry which thereafter reduces the diode bias potential to a level below the avalanche breakdown threshold level to terminate the avalanche condition. Subsequently, the bias potential is reapplied to the diode in preparation for detection of a subsequently received photon.

17 Claims, 4 Drawing Figures

PHOTON DETECTOR SYSTEM

BACKGROUND OF THE INVENTION

The present invention relates to low level light detecting devices and, more particularly, to a device capable of detecting receipt of individual photons over a wavelength range extending into the infrared region.

It is desirable in a number of light detecting applications to be able to sense the receipt of individual photons, since this represents the upper limit for resolution and sensitivity. Conventional prior art photon detectors have typically utilized photomultiplier tubes. When an incoming photon strikes the photocathode of a photomultiplier tube, an electron of the cathode material is given sufficient energy to escape from the surface of the cathode. The electron travels through the vacuum of the tube and enters an electron multiplier where it strikes a series of successively more positive electrodes. At each impact of the electron, additional secondary electrons are released, and further multiplication occurs. The movement of these electrons through the photomultiplier tube constitutes an electric current flow which may be detected, providing an indication that at least one photon has been received by the tube and has struck the surface of the photocathode.

Photomultipliers, however, have a number of disadvantages. Typically, they are relatively expensive, bulky and require substantial biasing voltages. Additionally, they are appropriate for use in a somewhat limited spectral range. Specifically, infrared photons of relatively long wavelength (greater than one micron) typically do not carry enough energy to release an electron from the cathode surface into the tube vacuum.

For a number of light sensing applications where the detection of individual photons is not required, semiconductor photodetectors, such as photodiodes, are utilized. Photodiodes are small, rugged, relatively inexpensive, and have a broader spectral response than photomultiplier tubes.

Photodiodes, however, as used in prior art devices, are not sufficiently sensitive to be able to detect individual photons. In a typical prior art circuit, a photodiode is reverse biased. A number of thermally generated free charge carriers are available in the diode material and provide conduction of a reverse or "dark" current through the device. When the diode is illuminated, photons strike the diode and impart sufficient energy to elevate additional electrons from the valence band into the conduction band and cause an additional light-generated "photo-current" to flow. This photocurrent is taken to indicate the absorption of light by the diode. However, only a single charge carrier pair is ordinarily generated by the absorption of an optical or infrared photon, and the resulting current is insufficient by itself to allow detection of an individual photon.

It is known to increase the reverse bias of such a photodiode until free charge carriers moving in the diode can pick up enough energy from the internal electric field to release additional carriers in collisions with the diode crystal lattice. These carriers release additional carriers in a process known as avalanche multiplication. Avalanche multiplication multiplies both dark current and photocurrent, with the result that a much larger current proportional to the original unmultiplied current flows in the diode. A diode operated in this mode, especially one specifically intended for such operation, is called an "avalanche photodiode."

The factor by which the current is multiplied by the avalanche effect is very critically dependent upon the bias voltage applied, and this dependence becomes rapidly more critical as the bias is raised to increase avalanche gain. If the bias is raised high enough, the multiplication factor becomes effectively infinite, a condition called avalanche breakdown. If an avalanche breakdown condition were permitted to persist, the avalanche diode would be quickly damaged. In order to control avalanche gain and avoid the dangers of avalanche breakdown, avalanche photodiodes are commonly operated with constant current bias. A set current is supplied to the diode, and the bias voltage is allowed to rise, increasing the avalanche gain until the gain is high enough so that the sum of dark current and photocurrent, multiplied by the gain, is equal to the bias current supplied. If the photocurrent increases, the required gain and therefore the required voltage bias decrease, thereby indicating the absorption of light. An alternative biasing arrangement, carefully controlled fixed voltage biasing, has proven less successful in the past due to the very critical bias control requirements and inherent instability of such a mode of operation.

The fact that a substantially steady dark current is required in order to help set the bias point of a continuously operating avalanche photodiode prevents its use as a detector of individual photons. The thermal generation rate of carriers in the diode must be high enough to provide a substantially steady current, and the fluctuations in that rate will mask the effects of a single charge carrier pair generated by an individual photon. Accordingly, this conventional mode of operation cannot be used to detect individual photons. Photodiodes, however, are well suited for use in infrared detection, since the energy carried by an infrared photon is sufficient to create a charge carrier pair in a suitable semiconductor.

It is known to cool a photosensitive semiconductor device to reduce the noise produced by thermally created free charge carriers in the device, as shown by U.S. Pat. Nos. 3,457,409 issued July 22, 1969, to Shenker et al; 3,445,659, issued May 20, 1969, to Guimento et al; 4,134,447, issued Jan. 16, 1979, to Frosch et al; 3,114,041, issued Dec. 10, 1963, to Amsterdam; 3,103,585, issued Sept. 10, 1963, to Johnson et al; 3,597,614, issued Aug. 3, 1971, to Bishop; 3,602,714, issued Aug. 31, 1971, to Farmer et al; 3,942,010, issued Mar. 2, 1976, to Peterson et al; 4,059,764, issued Nov. 22, 1977, to Belasco et al; and 4,118,947, issued Oct. 10, 1978, to Diedrich et al. While improving the sensitivity of the semiconductor photodetectors, these photodetectors are, nevertheless, not sufficiently sensitive so as to be able to detect individual photons. As noted previously, an avalanche photodiode, biased in a constant current mode, cannot take full advantage of the reduction in dark current produced by cooling.

Accordingly, it is seen that there is a need for a photosensitive semiconductor detector capable of detecting individual infrared photons.

SUMMARY OF THE INVENTION

A solid state photon detecting system capable of providing an electrical output signal upon receipt of a single infrared photon includes a semiconductor device having a pair of electrical leads connected thereto. The semiconductor device exhibits avalanche breakdown when one or more free charge carriers are present therein and an electrical potential in excess of a predetermined avalanche potential is placed across the pair of electrical leads. A biasing means supplies an electrical potential across the pair of electrical leads in excess of the predetermined avalanche potential.

A cooling means is provided for cryogenic cooling of the semiconductor device such that thermally generated charge carriers in the conduction band within the device are substantially eliminated, thus preventing avalanche breakdown in the absence of illumination. As a consequence, avalanche breakdown occurs only as a result of free charge carriers produced by photon absorption in the semiconductor device. A means is provided for sensing avalanche breakdown of the semiconductor device and for producing an electrical output signal in response thereto.

The semiconductor device may comprise a Schottky barrier diode with the biasing means comprising means for reverse biasing the diode. Alternatively, the semiconductor device may comprise a device of intrinsic material having a pair of ohmic contacts, or any other device exhibiting both photo-generation of charge carriers and avalanche breakdown.

The system may further include means for quenching said avalanche breakdown of the device by substantially and rapidly reducing the electrical potential across the electrical leads upon occurrence of avalanche breakdown. The means for quenching includes means for restoring the electrical potential across the pair of electrical leads, after avalanche breakdown is quenched, to a level in excess of the predetermined avalanche potential.

The means for sensing avalanche breakdown of the semiconductor device may comprise current sensing means for sensing avalanche current through the device. The means for quenching the avalanche breakdown may comprise switch means for electrically connecting current sensing means to one of the pair of electrical leads prior to avalanche breakdown and, subsequently, connecting the one of the pair of electrical leads to a quenching potential for a predetermined period of time.

A photon may be detected according to a method comprising the steps of:

(a) positioning a semiconductor device for receipt of a photon, the semiconductor device exhibiting avalanche breakdown when one or more free charge carriers are present in the device and an electrical potential in excess of a predetermined avalanche potential is placed across the pair of electrical leads;

(b) biasing the device electrically with a bias potential which exceeds the predetermined avalanche potential of the device, while at the same time cooling the device sufficiently to eliminate substantially all thermally generated electrical charge carriers in the device;

(c) detecting avalanche breakdown of the device upon receipt of a photon thereby;

(d) quenching the avalanche breakdown by reducing the bias potential below the predetermined avalanche potential; and (e) restoring the bias potential to a level exceeding the predetermined avalanche potential after the avalanche breakdown has been quenched, whereby a subsequently received photon may be detected.

The step of quenching the avalanche breakdown may include the step of applying a potential to one side of the device in opposition to the bias potential previously applied to the device, whereby the potential across the device is substantially reduced. The step of cooling the device may include the step of cryogenically cooling the device to eliminate substantially all thermally generated charge carriers from the conduction band.

The method may further include the step of counting the number of times the device experiences avalanche breakdown to provide an indication of the number of photons received by the device.

Accordingly, it is an object of the present invention to provide a photon sensing system capable of sensing a single photon, in which a semiconductor device having an avalanche breakdown characteristic is electrically biased to a potential above its avalanche potential and cooled sufficiently to prevent avalanche breakdown from occurring until a free charge carrier is created by receipt of a photon; to provide such a system in which the semiconductor device is cooled sufficiently to eliminate thermally generated charge carriers; to provide such a system in which the number of avalanche breakdowns is counted; and to provide such a system in which the semiconductor device is a reverse biased Schottky barrier device.

Other objects and advantages of the invention will be apparent from the following description, the accompanying drawings and the appended claims.

BRIEF DESCRIPTION OF THE INVENTION

DETAILED DESCRIPTION OF THE PREFERRED EMBODIMENT

Figure 1:
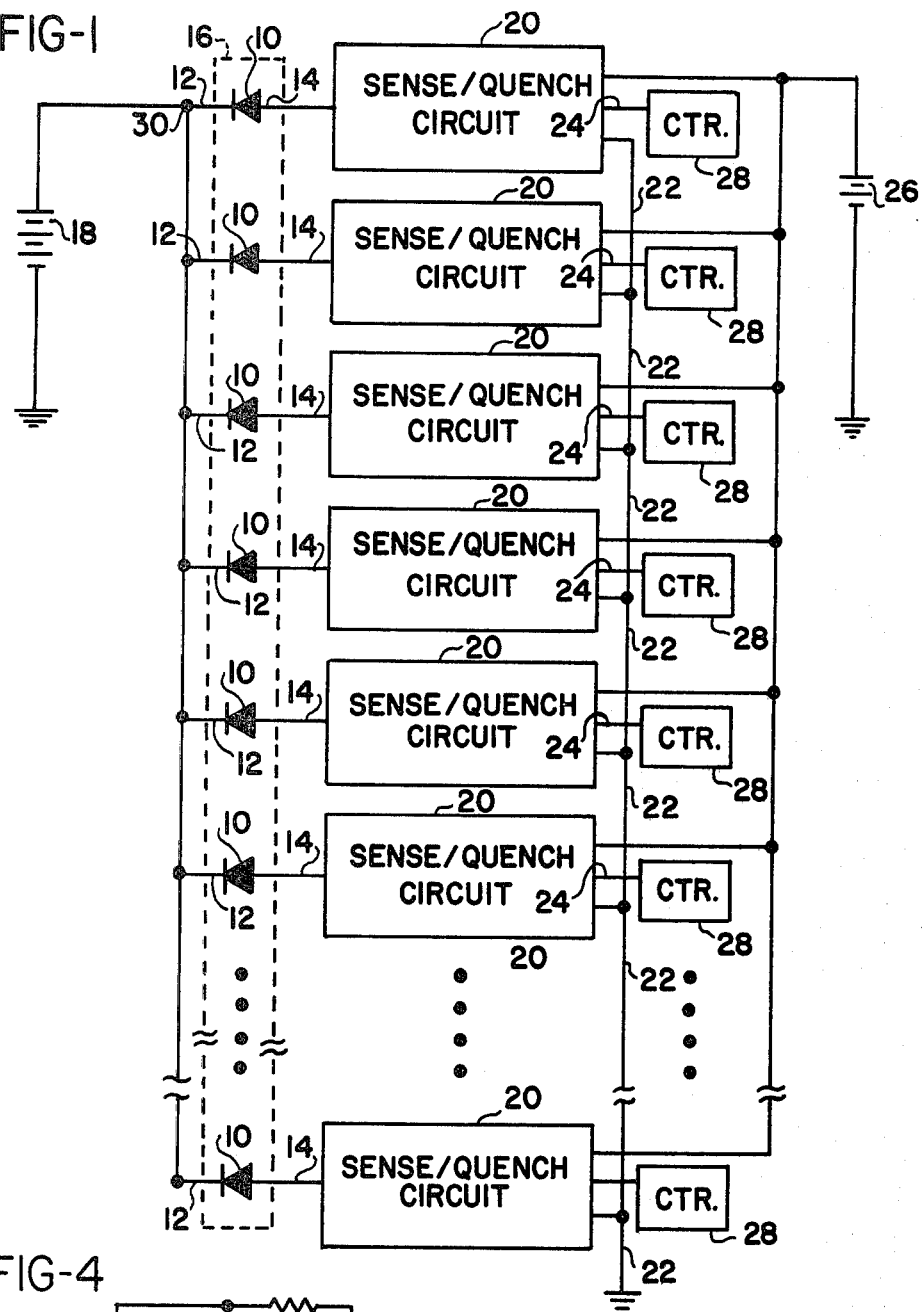
FIG. 1 is a schematic representation of a detector array for detecting receipt of photons and associated circuitry embodying the present invention.

FIG. 1 of the drawings illustrates the detector array of the present invention for detecting receipt of individual photons striking the array. A plurality of semiconductor devices 10 are provided, each such device including a pair of electrical leads 12 and 14 connected thereto. Each of the semiconductor devices 10 is of the type in which avalanche breakdown occurs when one or more free charge carriers are present within the semiconductor device and, simultaneously, an electrical potential in excess of a predetermined avalanche potential is placed across the pair of electrical leads 12 and 14.

Each of devices 10 may include a Schottky barrier diode, as shown, with the metal layer of the device being sufficiently thin so as to permit photons to enter the barrier region. Alternatively, each device may include a semiconductor of intrinsic material including a pair of ohmic contacts. When a Schottky barrier diode at room temperature is reverse biased, a certain quantity of reverse current will flow through the diode by virtue of thermally generated free charge carriers. Such carriers are created as electrons are raised from the valence band of the semiconductor material into the conduction band by thermal excitation to create electron/hole charge carrier pairs. Charge carrier pairs are also created by photons absorbed in the diode junction. As discussed above, even the relatively low energy level of an infrared photon is sufficient to produce a charge carrier pair in a suitable semiconductor device, although such a carrier pair does not by itself produce a detectable current flow. Increasing the difficulties encountered in detecting photon generated carriers is the noise produced by the thermally generated charge carriers.

In order to substantially eliminate thermal noise, the devices 10 are cooled cryogenically. A means for cooling the Schottky barrier devices 10 sufficiently to eliminate substantially all of the free thermally generated charge carriers in the devices includes a cryogenic cooling system, indicated generally at 16. This cooling system is of conventional construction and may generally be of the type used in prior art systems to cool other types of infrared detectors.

Although cooling eliminates substantially all of the thermally generated charge carrier pairs, the problem is still presented as to how a single charge carrier pair produced by the impact of a single photon is to be detected. In order to provide such detection, a d.c. voltage source 18 is provided for reverse biasing electrically each of the Schottky barrier devices. The potential across each of the devices is sufficiently large to cause avalanche breakdown in the presence of a charge carrier pair produced by photon absorption. As a consequence of the relatively large potential placed across each of the devices 10, a charge carrier pair created by a photon absorbed in the semiconductor device is accelerated and produces additional charge carrier pairs in an avalanche breakdown chain reaction such that a substantial current flow through the device is created. As a consequence, receipt of a single photon results in a large current flow through the device, which current flow is detectable.

If the avalanche current were not limited by associated circuitry or were permitted to flow for an appreciable period of time, the diode could be damaged. Additionally, it will be appreciated that once an avalanche breakdown condition is created within a semiconductor device, subsequently received photons will go undetected. In order to prevent damage to the Schottky barrier devices 10 and to terminate avalanche current flow in preparation for detection of subsequently received photons, a plurality of sense/quench circuits 20 are provided.

Circuits 20, discussed in detail below with respect to FIGS. 2 and 3, connect each of the diodes 10 to ground via line 22 prior to receipt of a photon. Thus, circuits 20 provide an electrical return path from the diodes 10 to the voltage source 18. Upon receipt of a photon by a diode 10, the associated circuit 20 disconnects the lead 14 of the diode from ground, provides an output pulse on line 24, indicating detection of a photon, and supplies a quench potential from quench voltage source 26 to the lead 14. Note that the polarity of the voltage supplied to the second lead 14 of the diode 10 is the same polarity as that of the voltage supplied to the first lead 12 of the diode 10. As a consequence, the voltage drop across the diode 10 is reduced to a level less than the predetermined avalanche potential level for the diode.

The avalanche condition is therefore terminated and, subsequent to termination, the associated circuit 20 reconnects the second lead 14 of the diode to ground via line 22 such that the diode is readied for detection of a subsequently received photon. If desired, the electrical pulse outputs on lines 24 may be counted by counters 28 which provide a means for counting successive avalanche current flow conditions experienced by each of the photosensitive Schottky barrier diodes 10, thus providing an indication of the number of photons received by each of the diodes.

The array circuitry is configured such that access to only one of the leads of each of the devices 10 is required both for sensing and for quenching avalanche breakdown. Each of the first leads 12 is connected to a common electrical node 30 with the voltage biasing means 18 being connected thereto. As a consequence, the array of devices 10 may be constructed on a single semiconductor chip, if desired, with a minimum number of chip connector pins being required. If the photodetectors employ a type of semiconductor material which is suitable for integrated circuit fabrication, such as silicon, the array of photodetectors, the sense/quench circuits and other associated circuitry may be fabricated on a single semiconductor chip.

Figure 2:
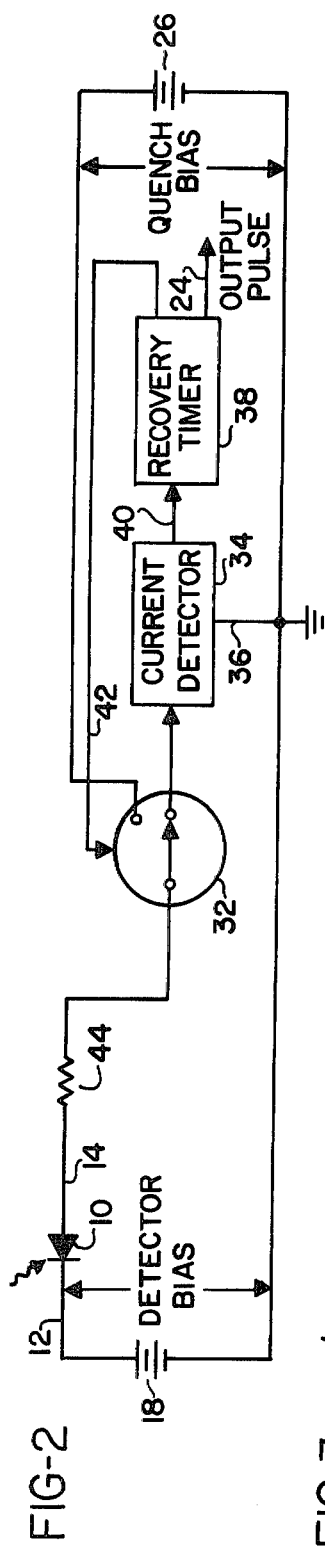
FIG. 2 is a schematic diagram of the circuit associated with one of the semiconductor devices of the array.

Reference is now made to FIG. 2 which illustrates the sense/quench circuit 20 associated with one of the diodes 10. This circuit senses the onset of avalanche current flow through the diode 10 and subsequently reduces the bias voltage across the diode to a level below the avalanche threshold level of the diode for a time period sufficient to terminate the avalanche condition and to clear the diode of free charge carriers. Subsequently, the circuit restores the full operating bias voltage across the diode 10. The circuit also provides an output pulse each time avalanche breakdown occurs, indicating the receipt by the diode of a photon.

The circuit of FIG. 2 connects lead 14 through an electronically controlled switch circuit 32 to a current detector circuit 34 which provides a path to ground through conductor 36. When current detector circuit 36 senses an avalanche breakdown, it provides a signal to recovery timer circuit 38 via conductor 40 which, in turn, provides an output on line 24 indicating a breakdown condition. At the same time, timer circuit 38 provides a control signal on line 42 which actuates switch 32 such that lead 14 is connected via current limiting resistor 44 to the quench potential provided by voltage source 26. The quench potential is of the same polarity with respect to ground as the bias potential provided by voltage source 18 and, therefore, the voltage drop across diode 10 is reduced to a voltage level less than the avalanche breakdown voltage level of the diode. As a consequence, the avalanche condition is terminated. After a sufficient recovery interval, timer circuit 38 actuates switch 32 such that lead 14 of diode 10 is again connected to ground via resistor 44 and current detector 34 and a potential greater than the avalanche breakdown potential level is reestablished across diode 10.

Figure 3:
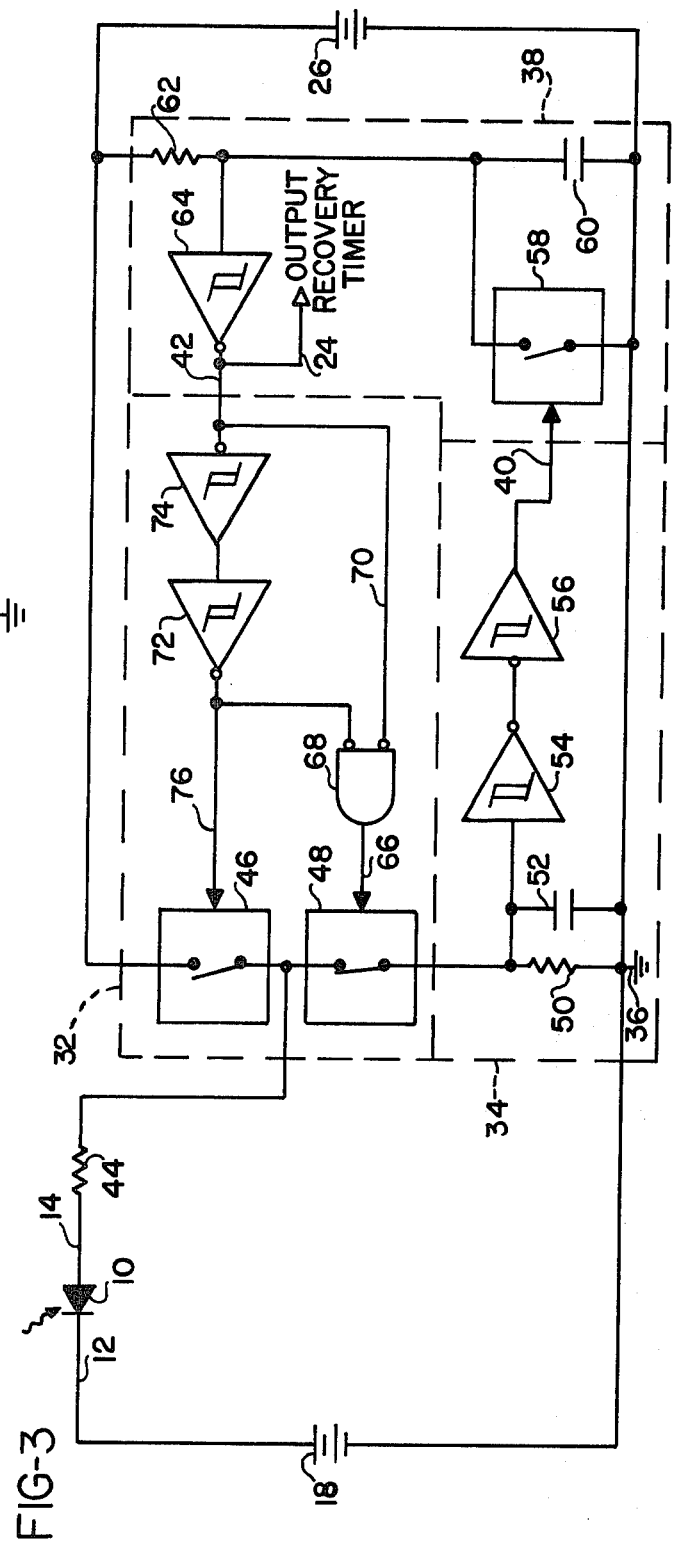
FIG. 3 is a schematic diagram showing the circuit of FIG. 2 in greater detail.

FIG. 3 illustrates the circuit of FIG. 2 in greater detail. In some instances, it may be preferable, from the viewpoint of ease of construction, to cool the circuits 20, as well as the diode array. In such a construction, these circuits may be implemented using standard semiconductor devices such as MOS transistors and Schottky diodes which are operable at cryogenic temperatures. The circuitry illustrated in FIG. 3 employs such devices exclusively, although the particular CMOS integrated circuits utilized may not be suitable for cryogenic operation. Cryogenically operable versions of the integrated circuits, or other functionally equivalent circuits, may however be fabricated.

Prior to the occurrence of avalanche breakdown, analog switches 46 and 48 of electronic switch 32 are in the switching states illustrated in which switch 48 is closed and switch 46 is open. These switches may be CD4066 analog switches, available from RCA Corporation.

The current detector circuit 34 includes resistor 50 and capacitor 52 which are connected electrically in parallel. The parallel combination of resistor 50 and capacitor 52 is connected electrically in series with the diode 10 and voltage source 18. When an avalanche breakdown occurs, current flowing through resistor 50 creates a voltage drop across the resistor 50 which exceeds the positive threshold level of the Schmitt trigger inverter circuit 54. Circuit 54 and Schmitt trigger inverter 56 are of conventional design and may, for example, be 74C14 Schmitt trigger circuits, available from National Semiconductor Corporation.

The voltage across resistor 50 produced during avalanche breakdown is inverted twice by circuits 54 and 56 such that the leading edge of a positive going, well defined pulse is applied to analog switch 58 in the recovery timer circuit 38. Switch 58, also a CD4066 switch, is actuated, electrically shorting capacitor 60 which was previously charged through resistor 62. Capacitor 60 discharges through switch 58 and when the voltage cross capacitor 60 drops below the negative logic threshold of Schmitt trigger circit 64, the leading edge of a positive going pulse is provided on line 24. This positive going pulse is also applied to the electronic switch circuit 32 via line 42 with the result that the output 66 of NOR gate 68, previously high, drops to low logic level. The NOR gate may be type CD4001, available from RCA Corporation. Switch 48 is therefore deactuated and the switch contacts open disconnecting diode 10 from circuit 34.

A short time later, the positive going output from line 42, having been delayed by Schmitt trigger inverter circuits 72 and 74, both 74C14 circuits, is applied to switch 46 via line 76, thus causing switch 46 to be actuated and providing a connection between voltage source 26 and lead 14 of diode 10. As a result of the delay provided by Schmitt trigger circuits 72 and 74, the switch 48 is always deactuated prior to actuation of switch 46. This eliminates the possibility that switches 46 and 48 might be closed simultaneously, connecting resistor 50 directly in series with voltage source 26.

The quench potential is supplied to lead 14 by voltage source 26 for a period of time sufficient for the avalanche breakdown of the diode 10 to be quenched. The current detector circuit 34 senses the cessation in current flow through resistor 50 and terminates the output signal on line 40, thus permitting capacitor 60 to recharge through resistor 62. When the voltage across capacitor 60 exceeds the positive logic threshold of Schmitt trigger inverter 64, the output pulse on line 42 is terminated. The switch circuit 32 is then actuated to reconnect diode 10 in series with voltage source 18 through current detector circuit 34. Switch 46 opens prior to the closing of switch 48.

At this point, the capacitance of diode 10 is recharged, producing a relatively small current pulse through the diode. Capacitor 52 is selected to be sufficiently large so that the peak voltage detected by Schmitt trigger inverter circuit 54 at this time does not exceed the detection threshold of the circuit. Capacitor 52 then discharges through resistor 50. A detection and quench cycle is now completed and diode 10 is again biased for subsequent detection of a photon.

Figure 4:
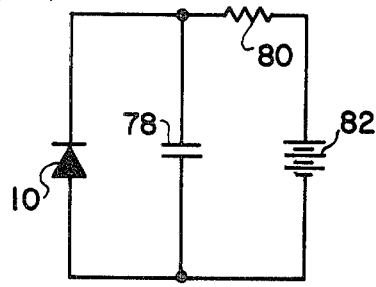
FIG. 4 is a schematic diagram of a circuit which may be utilized in place of the circuit shown in FIG. 2 in conjunction with one of the semiconductor devices of the array.

FIG. 4 illustrates a circuit arrangement which may be utilized in place of the quench circuit of FIG. 2 when a photodetector device of appropriate characteristics is utilized. Diode 10 is connected in parallel with capacitor 78 and in series with resistor 80 and voltage source 82. Photodiode 10 is biased to a voltage in excess of its avalanche breakdown voltage and capacitor 78 is charged to this biasing voltage by voltage source 82. Diode 10 is cryogenically cooled to eliminate substantially thermally generated charge carriers from the diode material. When receipt of a photon by the diode 10 initiates avalanche breakdown as described earlier, a large current passes through the diode 10, discharging capacitor 78.

Diode 10 is chosen to be of the type which exhibits a negative resistance characteristic in that, over some range of avalanche current, an increase in current flow decreases the voltage across the diode below the normal avalanche breakdown voltage. The resistor 80 is selected to be of such a value that in avalanche, the diode operates in its negative resistance current range. The avalanche threshold voltage is reduced by the large current passing through the diode while the capacitor 78 is being discharged. As a result, the voltage across the diode 10 and across the capacitor 78 is reduced below the normal avalanche threshold of the diode. When the diode current decreases after capacitor 78 is discharged, the avalanche threshold rises and the diode 10 momentarily has an insufficient voltage across its terminals to support avalanche breakdown. The avalanche breakdown is thus quenched and, after a suitable delay determined by the RC combination of capacitors 78 and resistor 80, the voltage across the diode 10 increases to a level exceeding the normal breakdown voltage of the diode. The avalanche condition has thus been quenched and the circuit is readied to detect subsequent absorption of a photon by the diode 10.

Detection of the occurrence of an avalanche condition can be accomplished by providing a voltage level detector across the diode 10 or by providing a current sensor in series with the diode 10, the capacitor 78, or the voltage source 82.

While the method herein described, and the form of apparatus for carrying this method into effect, constitute preferred embodiments of the invention, it is to be understood that the invention is not limited to this precise method and form of apparatus, and that changes may be made in either without departing from the scope of the invention.

What is claimed is:

1. A photon detection system capable of providing an electrical output signal upon receipt of a single photon, comprising:

a semiconductor device including a pair of electrical leads connected thereto, said device exhibiting avalanche breakdown when one or more free charge carriers are present therein and an electrical potential in excess of a predetermined avalanche potential is placed across said pair of electrical leads, biasing means for applying an electrical potential across said pair of electrical leads in excess of said predetermined avalanche potential, cooling means for cryogenic cooling of said semiconductor device such that thermally generated charge carriers within said device are substantially eliminated, whereby avalanche breakdown occurs as a result of free charge carriers produced by photon absorption by said semiconductor device, and means for sensing avalanche breakdown of said semiconductor device and for producing said electrical output signal in response thereto.

2. The system of claim 1 in which said semiconductor device comprises a Schottky barrier diode and in which said biasing means comprises means for reverse biasing said diode.

3. The system of claim 1 in which said semiconductor device comprises a device of intrinsic material having a pair of ohmic contacts spaced apart on said intrinsic material.

4. The system of claim 2 further comprising means for quenching said avalanche break down by substantially reducing the electrical potential across said electrical leads upon occurrence of avalanche breakdown.

5. The system of claim 4 in which said means for quenching said avalanche breakdown of said diode includes means for restoring said electrical potential in excess of said predetermined avalanche potential across said pair of electrical leads after said avalanche breakdown is quenched.

6. The system of claim 5 in which said means for sensing avalanche breakdown of said diode comprises current sensing means for sensing avalanche current through said diode and in which said means for quenching said avalanche breakdown comprises switch means for electrically connecting said current sensing means to one of said pair of electrical leads prior to avalanche breakdown and, subsequently, connecting said one of said pair of electrical leads to a quenching potential for a predetermined period of time.

7. A method of detecting receipt of a photon, comprising the steps of:

positioning a semiconductor device for receipt of a photon, said device exhibiting avalanche breakdown when one or more free charge carriers are present in said device and an electrical potential in excess of a predetermined avalanche potential is placed across said device, biasing said device electrically with a bias potential which exceeds said predetermined avalanche potential of said device, while at the same time cooling said device sufficiently to eliminate substantially all thermally generated electrical charge carriers in said device, detecting avalanche breakdown of said device upon receipt of a photon thereby, quenching said avalanche breakdown by reducing said bias potential below said predetermined avalanche potential, and increasing said bias potential to a level exceeding said predetermined avalanche potential after said avalanche breakdown has been quenched, whereby a subsequently received photon may be detected.

8. The method of claim 7 in which the step of quenching said avalanche breakdown includes the step of applying a potential to one side of said device in opposition to the bias potential previously applied to said device, whereby the potential across said device is substantially reduced.

9. The method of claim 7, further comprising the step of counting the number of times said device experiences avalanche breakdown to provide an indication of the number of photons received by said device.

10. The method of detecting a photon of claim 7 in which said step of cooling said device comprises the step of cryogenically cooling said device to eliminate substantially all thermally generated free charge carriers.

11. A detector array for detecting receipt of photons striking said array, comprising:

means defining a plurality of photon sensitive Schottky barrier devices arranged in an array, means for cooling said Schottky barrier devices sufficiently to eliminate substantially all of the free thermally generated charge carriers in said devices, voltage biasing means for reverse biasing electrically each of said Schottky barrier devices to a potential sufficient to cause a self-sustaining avalanche current flow in each such device in the presence of a charge carrier produced by photon absorption in the device, and means for detecting avalanche current flow through each of said Schottky barrier devices in said array, with detection of avalanche current flow through a device indicating receipt of a photon by said device.

12. The detector array of claim 11 in which each of said plurality of Schottky barrier devices includes first and second leads and in which each of said first leads is connected to a common electrical node and in which said voltage biasing means supplies a reverse biasing potential across each of said devices from said common electrical node to said each of said second leads.

13. The detector array of claim 12 further comprising a plurality of quench circuit means, each connected to a second lead of an associated one of said plurality of Schottky barrier devices, for selectively applying a quench potential to said second leads in response to a detection of avalanche current flow through said Schottky barrier devices, said quench potential being of the same polarity as the potential applied to said common electrical node.

14. The detector array of claim 11 further comprising means for counting successive avalanche current flow conditions experienced by each of said photosensitive Schottky barrier devices, thus producing an indication of the number of photons received by each of said devices.

15. A sensor for providing an electrical indication upon receipt of a photon having a wavelength in the infrared region, comprising:

a semiconductor device including a pair of electrical leads, said device exhibiting avalanche current flow in which the presence of a single free charge carrier in the material making up said device produces a substantial number of charge carriers in said conduction band when an electrical potential in excess of an avalanche potential level is supplied to said leads, whereby a self-sustaining current flow between said leads is initiated, and means for cooling said semiconductor device to a cryogenic temperature at which substantially all of the thermally generated charge carriers are removed from said conduction band, whereby a photon striking said device elevates a charge carrier to said conduction band, producing avalanche current flow.

16. The device of claim 14 in which said device comprises a Schottky barrier semiconductor.

17. The device of claim 14 which said device comprises a semiconductor device of intrinsic material having a pair of ohmic contacts.

* * * * *